(12) United States Patent
Barabash et al.

(10) Patent No.: US 9,222,170 B2
(45) Date of Patent: Dec. 29, 2015

(54) DEPOSITION OF RUTILE FILMS WITH VERY HIGH DIELECTRIC CONSTANT

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 440 days.

(21) Appl. No.: 13/721,606

(22) Filed: Dec. 20, 2012

(65) Prior Publication Data

US 2014/0175422 A1 Jun. 26, 2014

(51) Int. Cl.

| | |
|---|---|
| *H01L 21/02* | (2006.01) |
| *H01L 23/58* | (2006.01) |
| *C23C 16/40* | (2006.01) |
| *H01L 45/00* | (2006.01) |
| *H01L 27/12* | (2006.01) |
| *H01L 27/24* | (2006.01) |
| *C23C 16/02* | (2006.01) |
| *C30B 25/04* | (2006.01) |
| *C30B 29/16* | (2006.01) |
| *C30B 29/60* | (2006.01) |
| *H01L 29/66* | (2006.01) |
| *H01L 29/78* | (2006.01) |
| *B82Y 40/00* | (2011.01) |
| *H01L 27/06* | (2006.01) |
| *H01L 49/02* | (2006.01) |

(52) U.S. Cl.
CPC ............ *C23C 16/405* (2013.01); *C23C 16/0272* (2013.01); *C30B 25/04* (2013.01); *C30B 29/16* (2013.01); *C30B 29/60* (2013.01); *H01L 21/02186* (2013.01); *H01L 27/1233* (2013.01); *H01L 27/2436* (2013.01); *H01L 29/66795* (2013.01); *H01L 29/785* (2013.01); *H01L 45/04* (2013.01); *H01L 45/1233* (2013.01); *H01L 45/149* (2013.01); *B82Y 40/00* (2013.01); *H01L 27/0629* (2013.01); *H01L 28/40* (2013.01); *H01L 2924/0002* (2013.01); *Y10S 977/811* (2013.01); *Y10S 977/89* (2013.01); *Y10S 977/932* (2013.01)

(58) Field of Classification Search
CPC . H01L 21/02186; H01L 28/40; C01G 23/047
USPC ............ 438/253, 393, 396; 428/141; 209/552
See application file for complete search history.

(56) References Cited

U.S. PATENT DOCUMENTS

| | | | | |
|---|---|---|---|---|
| 6,858,478 B2 * | 2/2005 | Chau | ...................... | B82Y 10/00 257/E29.137 |
| 7,759,150 B2 * | 7/2010 | Zhang | .................... | B82Y 10/00 257/419 |

(Continued)

OTHER PUBLICATIONS

Gao, M., et al.; Effect of Substrate Pretreatment on Controllable Growth of TiO2 Nanorod Arrays; Elsevier; Journal of Materials Sciences and Technology, pp. 577-586.

*Primary Examiner* — Bradley K Smith
*Assistant Examiner* — David Goodwin

(57) ABSTRACT

Anisotropic materials, such as rutile $TiO_2$, can exhibit dielectric constant of 170 along the tetragonal axis of (001) direction, and dielectric constant of 86 along directions perpendicular to the tetragonal axis. Layer of anisotropic material nanorods, such as $TiO_2$ nanorods, can form a seed layer to grow a dielectric layer that can exhibit the higher dielectric constant value in a direction parallel to the substrate surface. The anisotropic layer can then be patterned to expose a surface normal to the high dielectric constant direction. A conductive material can be formed in contact with the exposed surface to create an electrode/dielectric stack along the direction of high dielectric constant.

18 Claims, 7 Drawing Sheets

(56) References Cited

U.S. PATENT DOCUMENTS

| | | | |
|---|---|---|---|
| 7,927,947 B2 * | 4/2011 | Rui | C23C 16/02 257/E21.01 |
| 8,896,097 B2 * | 11/2014 | Wamura et al. | 257/532 |
| 2004/0041196 A1 * | 3/2004 | Wieczorek et al. | 257/310 |
| 2012/0183728 A1 | 7/2012 | Wang et al. | |

* cited by examiner

U.S. 9,222,170 B2

DEPOSITION OF RUTILE FILMS WITH VERY HIGH DIELECTRIC CONSTANT

FIELD OF THE INVENTION

This invention relates generally to nonvolatile memory elements, and more particularly, to methods for forming resistive switching memory elements used in nonvolatile memory devices.

BACKGROUND

Materials with high dielectric constant are desired for many modern electronics applications that involve a capacitor-like element, including DRAM and transistor gates. High dielectric constant values can correlate with small band gap, thus the requirement that the dielectric has a sufficient gap (typically >~3 eV) makes it difficult to increase dielectric constant by purely chemical means.

Rutile materials, such as rutile titanium dioxide ($TiO_2$), have been used as dielectric materials for high dielectric constant applications. $TiO_2$-based dielectric materials have the potential to exhibit relatively high dielectric constant values. However, the effective dielectric constant, $k_{eff}$, typically remains below 100.0 (e.g., 80-90).

However, high dielectric constant values have been discovered for $TiO_2$ single crystals when measured along a tetragonal axis (i.e. along the [001] direction). For example, a single crystal rutile $TiO_2$ material at room temperature, and frequencies in the $10^2 \ldots 10^6$ Hz range, has been found to exhibit dielectric constant values of $\kappa_\perp = 86$ and $\kappa_\parallel = 170$, when the field is applied respectively perpendicularly and parallel to [001].

As such, the effective dielectric constant values exhibited in semiconductor devices suggest that for a typical modern semiconductor manufacturing sequence, the materials crystallize in a manner such that the effective dielectric constant is reflected by the smaller dielectric constant $\kappa_\perp$ value. At best, a polycrystalline rutile film with randomly oriented crystallites may be utilized, in which case, the effective dielectric constant $\kappa_{eff}$ value is an average of $\kappa_\perp$ and $\kappa_\parallel$ with a twice larger weight given to the smaller dielectric constant $\kappa_\perp$ value. The exact form of averaging that describes the effective dielectric constant value, $\kappa_{eff}$, depends on crystal microstructure, but an approximate value can be calculated using the effective medium approximation, which for randomly oriented crystallites in rutile TiO2 can yield $\kappa_{eff} \approx 110$. In fact, the actual $\kappa_{eff}$ values of polycrystalline rutile TiO2 with randomly oriented crystallites may be lower than 110 due to imperfections present in the $TiO_2$ polycrystal.

Therefore, there is a need to increase the effective dielectric constant values of dielectric materials within semiconductor-based capacitive devices.

SUMMARY

In some embodiments, methods, and devices fabricated from methods, to form dielectric layer having high dielectric constant are provided. The dielectric layers can include anisotropic materials that can have different dielectric constant in different directions. For example, rutile materials, such as $TiO_2$, can exhibit dielectric constant of 170 along the tetragonal axis of (001) direction, and dielectric constant of 86 along directions perpendicular to the tetragonal axis. The dielectric layers can be incorporated in electronic devices utilizing high dielectric constant materials, such as capacitor devices, memory devices, and transistor devices such as finFET transistors.

In some embodiments, the methods can include utilizing a seed layer to grow an anisotropic layer having a desired orientation. The anisotropic layer can then be patterned to expose a surface normal to the high dielectric constant direction. A conductive material can be formed in contact with the exposed surface to create an electrode/dielectric stack along the direction of high dielectric constant. For example, the anisotropic layer can include rutile $TiO_2$, with the high dielectric constant direction along the (001) crystallographic orientation.

In some embodiments, the seed layer can be formed by placing multiple nanorods on a substrate surface so that the nanorods are aligned, or substantially aligned, along a certain direction. The nanorods can be $TiO_2$ nanorods, formed by a seeding and hydrothermal sequence. The nanorods can grow along the (001) crystallographic orientation, which is the direction of higher dielectric constant, as compared to other directions. The diameter of the nanorods can be between 20 to 80 nm, such as between 40 and 60 nm.

In some embodiments, a dielectric layer with the same material is formed on the seed layer. For example, a dielectric layer of $TiO_2$ is grown on the $TiO_2$ nanorods. The dielectric layer can be processed, e.g., depositing and treating, under conditions to achieve similar crystal structure as the nanorods. For example, a dielectric layer of $TiO_2$ can be deposited on a layer of $TiO_2$ nanorods, e.g., by a deposition technique such as atomic layer deposition (ALD) or chemical vapor deposition (CVD). The deposition process can use the nanorods as a crystallization seeds. After deposition, the deposited layer can be annealed, for example, between 300 and 600 C, such as between 400 and 450 C, to crystallize the materials in the deposited layer. Multiple sequences of deposition and annealing can be performed to grow a thicker film. For example, individual layers between 50 and 100 nm can be deposited and then annealed.

A conductive region can be formed in contact with the exposed surface of the dielectric layer. In some embodiments, two conductive regions can be formed, sandwiching the dielectric layer in the direction of high dielectric constant, e.g., the (001) direction that offers higher dielectric constant of $TiO_2$ material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
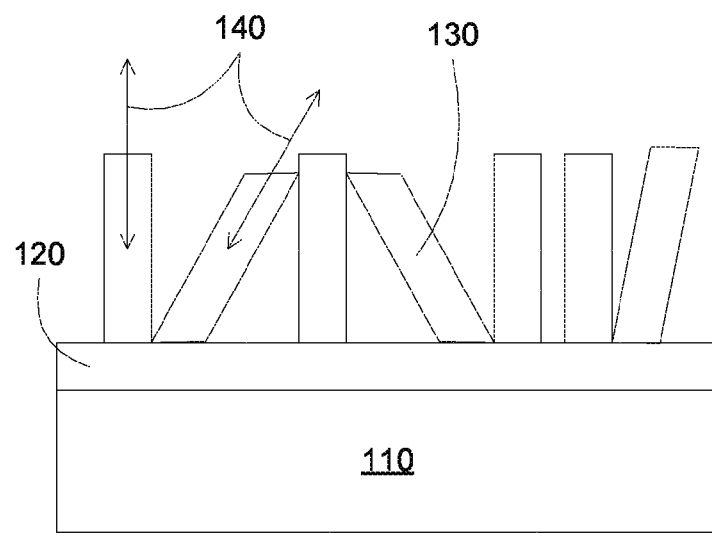
FIGS. 1A-1B illustrate a process to form $TiO_2$ nanorods according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, anisotropic dielectric materials are prepared and processed to maximize the dielectric constant along the direction of the applied field. The anisotropic dielectric structures can be used in semiconductor devices such as capacitor structures, memory structures and transistor structures.

In some embodiments, methods, and devices fabricated from methods, to form structures having high dielectric constant dielectric layers are provided. The dielectric layers can include anisotropic materials that can have different dielectric constant in different directions. For example, rutile materials, such as $TiO_2$, can exhibit higher dielectric constant (e.g., 170) along the tetragonal axis of (001) direction, and lower dielectric constant (e.g., 86) along directions perpendicular to the tetragonal axis. The structures can include capacitor devices, memory devices, and transistor devices such as FinFET transistors.

In some embodiments, the methods can include forming a seed layer on a substrate surface so that the seed layer exhibits a high dielectric constant in a direction parallel to the substrate surface. For example, the seed layer can include rutile $TiO_2$ having (001) crystallographic orientation arranged in a direction along the substrate surface. A dielectric layer is then grown on the seed layer, e.g., forming a thicker rutile $TiO_2$ layer with similar crystallographic orientation as that of the seed layer. The dielectric layer is then patterned to expose a surface having a normal direction that can exhibit high dielectric constant. For example, the rutile $TiO_2$ can be patterned to expose a surface having the normal direction along the (001) crystallographic orientation. By applying an electric field along this (001) crystallographic orientation, high dielectric constant value of rutile $TiO_2$ layer can be achieved.

When $TiO_2$ crystallizes as a polycrystal with randomly oriented crystallites, the effective dielectric constant is a certain average of $\kappa_\perp$ and $\kappa_\parallel$, much lower than $\kappa_\parallel$. The specific average value depends on crystallization microgeometry, but it can be approximately evaluated using the effective-medium approximation. For rutile $TiO_2$ ($\kappa_\perp$=86 and $\kappa_\parallel$=170) this predicts the effective value to be only $\kappa_{eff}$=110. In actual dielectric stacks, additional lower-κ regions, coming from alloying with other elements or from various defects of rutile structure, further decrease the effective κ.

Nanorods of rutile $TiO_2$ can grow along (001) direction, because this minimizes the (001) facets with a very large surface energy and allows to maximize the area of (110) facets believed to have the minimal surface energy. As a result, when the nanorods align on the substrate, their tetragonal axes also become aligned in the same chosen direction. During crystallization of the subsequent layers of the film, the nanorods can serve as crystallization seeds, so that this chosen orientation will become the tetragonal axis of any crystallite in the film. Thus independent formation of crystallites with any other orientation will be suppressed by a nucleation barrier.

In some embodiments, the resulting film can contain a large number of high-quality crystallites with relatively high κ, such as $\kappa_\parallel \approx 170$, along the chosen direction. The film can be separated by some amorphous material with lower κ. Since the fraction of the amorphous material can be small, and the device geometry can be patterned to provide the electric fields parallel to the tetragonal axis of the film, the dielectric constant relevant to the operation of such structures will be close to $\kappa_\parallel \approx 170$.

In some embodiments, the seed layer can include nanorod materials that grow in a preferred direction. For example, nanorods of rutile $TiO_2$ can be fabricated to grow in a (001) direction, and then collected and arranged to form the seed layer with nanorods substantially arranged along the (001) direction.

Nanorods, such as $TiO_2$ nanorods, can be prepared on a separate substrate by standard techniques, e.g. hydrothermal growth on a seeded substrate. The nanorods can be separated from the separate substrate (e.g. by mechanical means) and can be kept as a collection of powdered or suspended nanorods. This collection can be processed to obtain nanorods having high aspect ratio and uniform dimension.

Figure 1B:
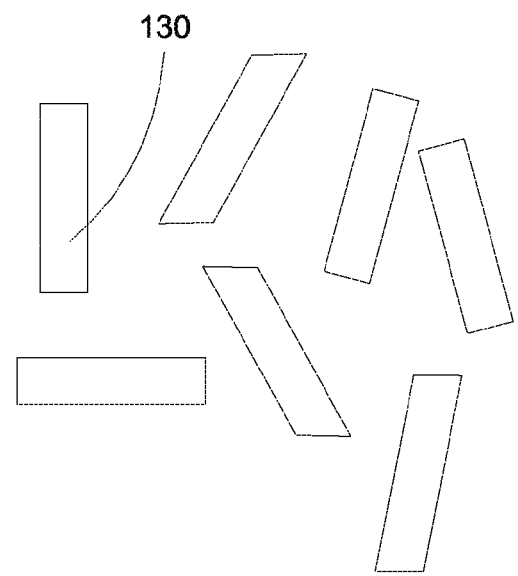

FIGS. 1A-1B illustrate a process to form $TiO_2$ nanorods according to some embodiments. In FIG. 1A, a substrate such as a quartz substrate 110 can be coated with a $TiO_2$ colloid solution, which can serve as a seed layer 120 to grow $TiO_2$ nanorods. $TiO_2$ nanorods can be prepared by hydrothermal synthesis, in which the seeded substrate 110/120 can be immersed in a titanium precursor solution at high temperature. Well aligned $TiO_2$ nanorods 130 can be formed on the substrate 110, with (001) crystallographic orientation 140. In FIG. 1B, the nanorods 130 can be collected to be used as a seed layer for forming the dielectric layer with high dielectric constant. The nanorods can be screened to obtain nanorods having high aspect ratio, e.g., at least greater than 5, and can be much greater than 10. The diameter of the nanorods can be between 20 to 80 nm, such as between 40 and 60 nm.

In some embodiments, the nanorods can be aligned on a substrate, e.g., a semiconductor substrate, to form a seed layer for the high dielectric constant layer. The nanorods can be placed sideway along a certain direction, e.g., the (001) crystallographic orientation of the $TiO_2$ nanorod crystal, can be substantially parallel to each other. In some embodiments, the substrate can be covered with the aligned nanorods with between 50% and 100% coverage. For example, the substrate can be covered by an average of at least 0.5 layer to more than 1 layer of nanorods.

In some embodiments, the substrate can be prepared to accept the nanorods. For example, the substrate can be processed to form grooves along a desired direction on the surface. The nanorods, which have been grown on a seeded substrate as described above, can be poured on the grooved substrate. Mechanical agitation can be supplied to the substrate to distribute the nanorods to the grooves. The vibration can stop when the arrangement of the nanorods on the substrate reaches a steady state. For example, the nanorods can cover between 50 and 100% of the substrate surface. The vibration process can have a vibration amplitude in the order of the diameter of the nanorods, e.g., 0.5 to 1.5 times the diameter of the nanorods, which is about 30 to 300 nm. The vibration process can have a vibration frequency greater than $\sqrt{g/d}$, with g being the strength of the gravitational field (9.81 m/s$^2$ in MKS unit) and d being the nanorod diameter. The grooves can have a diameter between 0.5 and 3× of the nanorod diameter, such as between 1 and 3×, which is about 250 to 600 nm. The separation between the grooves (e.g. between the centers of two adjacent grooves) may be between 1 and 5× of the nanorod diameter, such as between 1.5 and 3×. The grooves can have a depth between 0.3 and 0.8× of the nanorod diameter, which is about 15 to 160 nm. The nanorod diameter here can refer to the average diameter of the utilized nanorods. The groove diameter here can refer to the largest lateral width of the groove feature and does not need to imply a circular cross-section profile, nor needs to refer to the radius of any cross-sectional profile features.

Figure 2A:
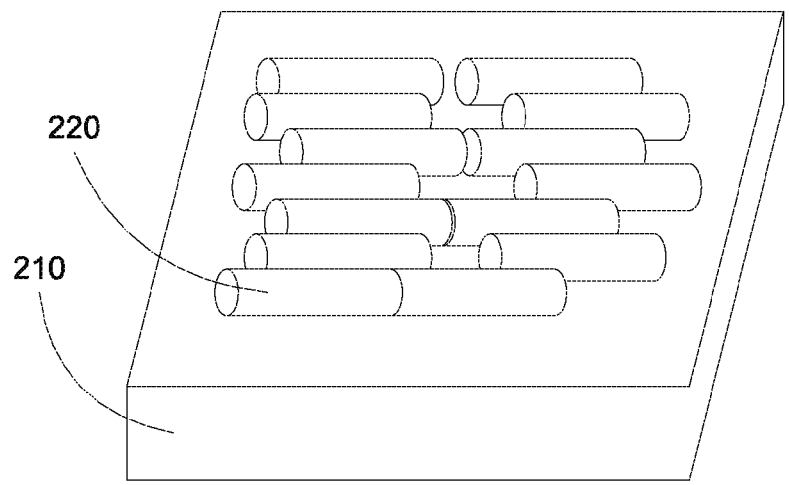
FIGS. 2A-2B illustrate nanorod configurations on a substrate according to some embodiments.
Figure 2B:
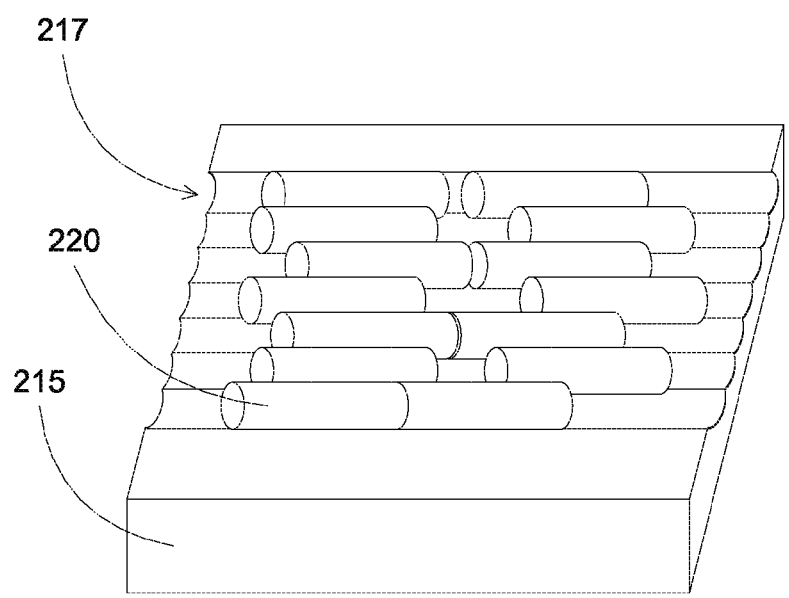

FIGS. 2A-2B illustrate nanorod configurations on a substrate according to some embodiments. In FIG. 2A, multiple nanorods 220 can be placed on a substrate 210. The nanorods are aligned, or substantially aligned, in a certain direction on the substrate surface. For example, the nanorods can be placed sideway on the substrate, with the nanorods placed next to each other and facing a same direction. In FIG. 2B, the substrate 215 can be grooved, e.g., grooves 217 can be formed on the surface of the substrate to facilitate the alignment of the nanorods.

In some embodiments, methods, and devices fabricated from the methods, to form high dielectric constant layer are disclosed. The materials used in the high dielectric constant layer can be anisotropic materials having different values of the dielectric constant in different crystal orientations. For example, the dielectric constant of rutile TiO$_2$ in the (001) direction can be about two times larger than that in other directions. By aligning the anisotropic materials so that the direction of high dielectric constant is placed along an applied electric field, the anisotropic materials can exhibit the high value of the dielectric constant.

As a specific example, TiO$_2$ nanorods can be placed on a substrate, with the (001) high dielectric constant substantially aligned in a direction parallel to the substrate surface. TiO$_2$ then can be deposited on the nanorods to form a thicker layer of similar crystal orientation. For example, the deposited TiO$_2$ can be formed, e.g., via depositing and treating, under conditions to achieve similar crystal structure as the nanorods. The dielectric layer of TiO$_2$ can be deposited on a layer of TiO$_2$ nanorods, e.g., by a deposition technique such as atomic layer deposition (ALD) or chemical vapor deposition (CVD). The deposition process can use the nanorods as a crystallization seeds. After deposition, the deposited layer can be annealed, for example, between 400 and 450 C, to crystallize the materials in the deposited layer. Multiple sequences of deposition and annealing can be performed to grow a thicker film. For example, individual layers between 50 and 200 nm can be deposited and then annealed. The deposition/anneal sequence can be optimized to crystallize each newly deposited layer after each deposition/annealing sequence. For example, a single deposited layer of appropriate thickness can be annealed so that the annealing process does not lead to nucleation of new rutile seeds, but instead crystallizes the newly deposited TiO$_2$ materials using the previously-crystallized materials as a seed, so that all the crystallized TiO2 material is structurally linked to the nanorods.

The dielectric layer can have a high dielectric constant along the direction of the length of the nanorods, e.g., along a direction parallel to the substrate surface. The dielectric layer can be patterned to expose a surface substantially perpendicular to the direction of high dielectric constant. The patterning process can be performed by a photolithography process, including masking a portion of the dielectric layer and etching away an undesired portion.

A conductive region can be formed in contact with the exposed surface of the dielectric layer. In some embodiments, two conductive regions can be formed, sandwiching the dielectric layer in the direction of high dielectric constant, e.g., the (001) direction that offers higher dielectric constant of TiO$_2$ material.

Figure 3A:
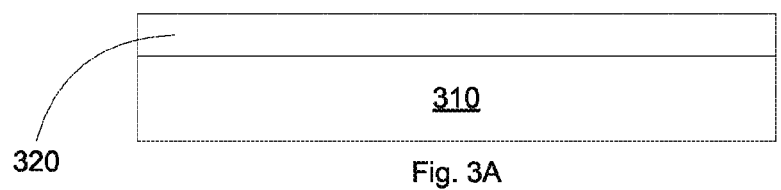
FIGS. 3A-3D illustrate a process sequence for forming a high dielectric constant layer according to some embodiments.

FIGS. 3A-3D illustrate a process sequence for forming a high dielectric constant layer according to some embodiments. In FIG. 3A, a substrate 310 can have a seed layer 320 formed thereon. In some embodiments, the substrate 310 can be a semiconductor substrate, such as a silicon substrate, a germanium substrate, a silicon-germanium substrate, or any other substrates having a layer of semiconductor layer. In some embodiments, the substrate 310 can be a dielectric substrate, such as an amorphous silicon dioxide substrate. The seed layer 320 can include TiO$_2$ nanorods, as described above. For example, the substrate 310 can have multiple grooves, and TiO$_2$ nanorods can be placed in the grooves of the grooved surface. A high dielectric constant direction can be along a (001) direction of the nanorods, which is parallel to the substrate surface.

Figure 3B:
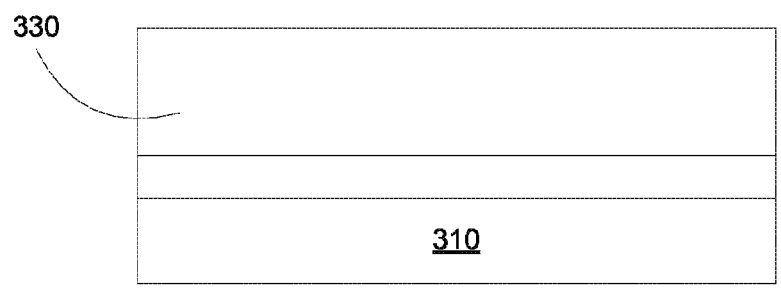

In FIG. 3B, a layer 330 of TiO$_2$ can be deposited on the seed layer 320. The deposition conditions of the TiO$_2$ layer can be optimized so that the deposited TiO$_2$ layer can preserve the crystal orientation of the seed layer, e.g., maintaining a (001) crystal orientation along the direction parallel to the substrate surface. The deposition process can include atomic layer deposition (ALD), chemical vapor deposition (CVD), plasma enhanced atomic layer deposition (PEALD), plasma enhanced chemical vapor deposition (PECVD), or any other deposition technique. Optional annealing process can be performed, for example, at temperature between 400 and 450 C to crystallize (or recrystallize) the TiO$_2$ layer. Multiple sequences of deposition and anneal can also be performed, for example, to facilitate the forming of the crystallized TiO$_2$ layer while minimizing the likelihood of nucleating new crystalline seeds structurally independent of the seed layer 320. For example, thin TiO$_2$ layer, e.g., 50-200 nm, can be deposited and annealed, before another layer of TiO$_2$ can be deposited and annealed, to achieve TiO$_2$ layer with any desirable thickness.

After the described deposition, the TiO$_2$ layer 330 will be anisotropic with the tetragonal axis along the nanorod placement direction, which lies in the plane of the substrate surface. The tetragonal axis typically corresponds to higher dielectric constant value. The TiO$_2$ layer 330 can then be etched normal to this direction, and further elements such as electrodes and additional dielectric layers can be created.

Figure 3C:
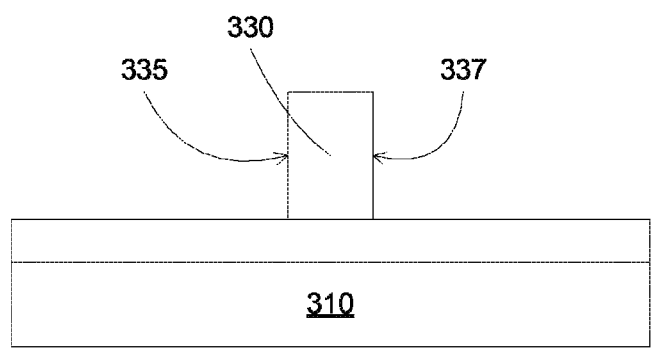
Figure 3D:
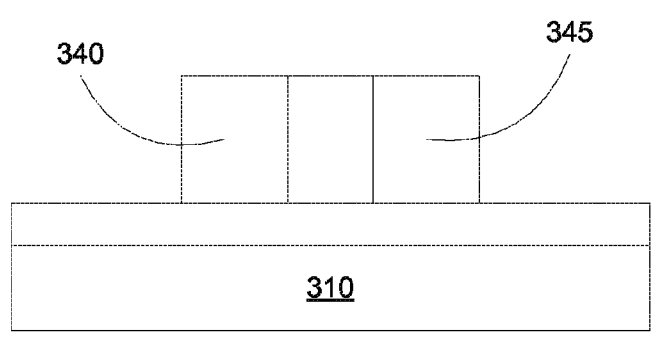

In FIG. 3C, the TiO$_2$ layer 330 is patterned to expose surfaces 335 and 337 of high dielectric constant, e.g., a surface that an electric field normal to that surface can experience the high dielectric constant characteristic of the TiO$_2$ layer. In FIG. 3D, conductive materials 340 and 435 can be formed, contacting the exposed surfaces 335 and 337. The geometry of the etched/deposited structures, e.g., conductive 340/345 and dielectric 330, can be chosen so that the electric field applied to the dielectric layer between any electrodes is parallel to the tetragonal axis. For example, a voltage applied between the two conductive materials 340 and 345 can generate an electric field perpendicular to the surfaces 335 and 337, resulting in the dielectric material 330 exhibiting high dielectric constant. The electrical properties of the capacitor formed by the electrodes 340 and 345 and the dielectric layer 330 will be determined by the larger value of the dielectric constant.

In some embodiments, devices can be fabricated using the high dielectric constant layer. For example, a capacitor structure, including two conductive regions sandwiching the dielectric layer, can be formed as discussed above. Similarly, other devices can incorporate the high dielectric constant layer, such as a dynamic random access memory (DRAM) including a controlled transistor coupled to a capacitor. The high dielectric layer can be used as the vertical gate dielectric in a fin field effect transistor (finFET).

Figure 4A:
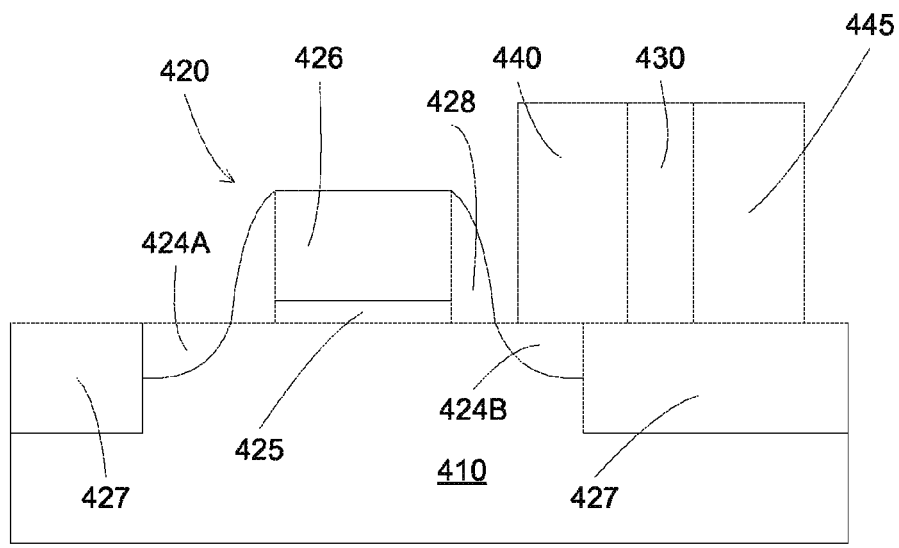
FIG. 4A illustrates an example of a memory cell according to some embodiments.

FIG. 4A illustrates an example of a memory cell according to some embodiments. A transistor structure 420 is formed on a substrate 410, including isolation regions 427 to isolate the neighboring devices, source and drain regions 424A and 424B sandwiching a gate electrode having a gate dielectric 425 and a gate conductor 426. Spacers 428 can cover the sidewalls of the gate electrode. The substrate can be a semiconductor substrate, or any substrates having a layer of semiconductor layer. For example, the substrate can be a single crystal silicon substrate. The substrate can be a silicon-germanium substrate, or can have a silicon germanium layer disposed on top. The substrate can also be a germanium substrate, or a silicon carbide substrate. The gate conductor can include doped polysilicon. A metal-oxide-semiconductor field effect transistor (MOSFET) structure is shown, but the invention is not so limited, and can include any transistor structure, such as bipolar transistors. In addition, the process flow can include a silicidation process for gate electrode and on source and drain regions. A capacitor device, including a vertical dielectric component 430, sandwiched by two electrodes 440 and 445, can be connected to the drain 424B (or source 424A) of the transistor. The capacitor device can utilize the high k material as described above. The capacitor device is shown in direct contact with the transistor structure, but the invention is not so limited, and the capacitor device can be spatially separated from the transistor device and electrically connected to it by additional means, such as an additional interconnect structure.

Figure 4B:
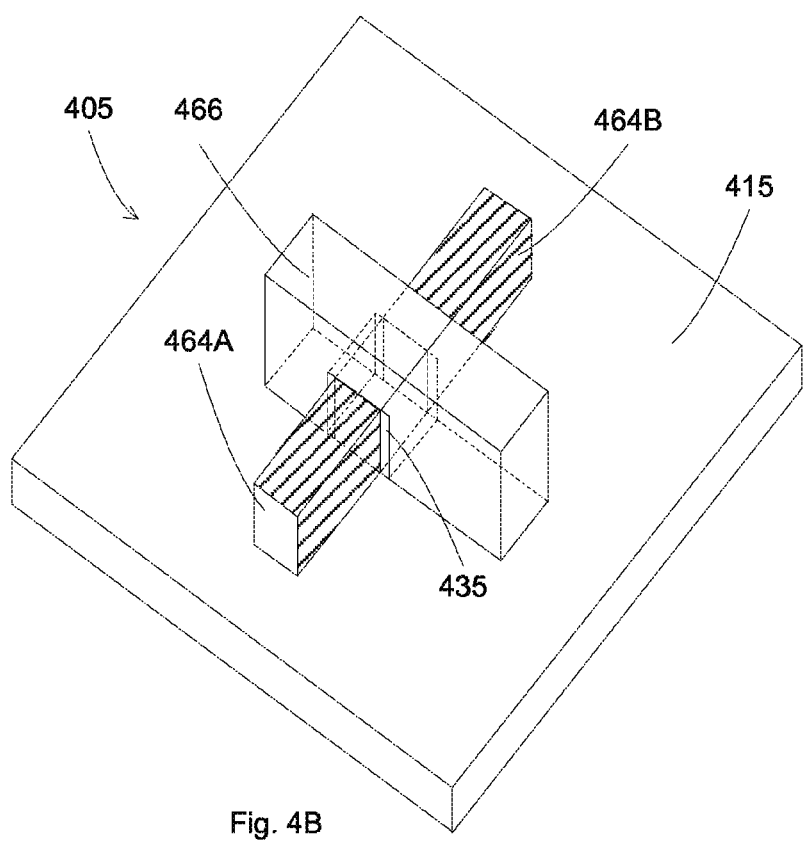
FIG. 4B illustrates an example of a finFET device according to some embodiments.

FIG. 4B illustrates an example of a finFET device according to some embodiments. A finFET device 405 having a semiconductor body having a fin shape formed on a substrate 415. Source/drain regions 464A/464B can be formed at opposite ends of the semiconductor body. A gate dielectric 435 can be formed on a portion between the source and drain regions, which becomes a channel region of the finFET device. The gate dielectric 435 can include a high dielectric constant material, such as $TiO_2$, grown through a seed layer of $TiO_2$ nanorods. A gate electrode 466 can be formed on the gate dielectric 425. The source/drain regions can be doped, for example, with p-type or n-type dopants to form p-type or n-type devices. The doping of the source/drain regions can be accomplished by doping the whole semiconductor body, using the gate electrode to act as a mask to prevent the channel region from being doped. As shown, the gate dielectric and the gate electrode surround the channel on two sides, forming a double-gate finFET device.

In some embodiments, methods to form devices having a high dielectric constant material can be provided. The methods can include forming a $TiO_2$ layer on a $TiO_2$ nanorod seed layer, and then patterning the $TiO_2$ layer to expose a surface having high dielectric constant. The $TiO_2$ layer can be annealed to achieve a same crystallinity as the seed layer. Electrodes can be formed in contact with the exposed surface to form a device exploiting the high dielectric constant characteristic of the $TiO_2$ layer.

Figure 5:
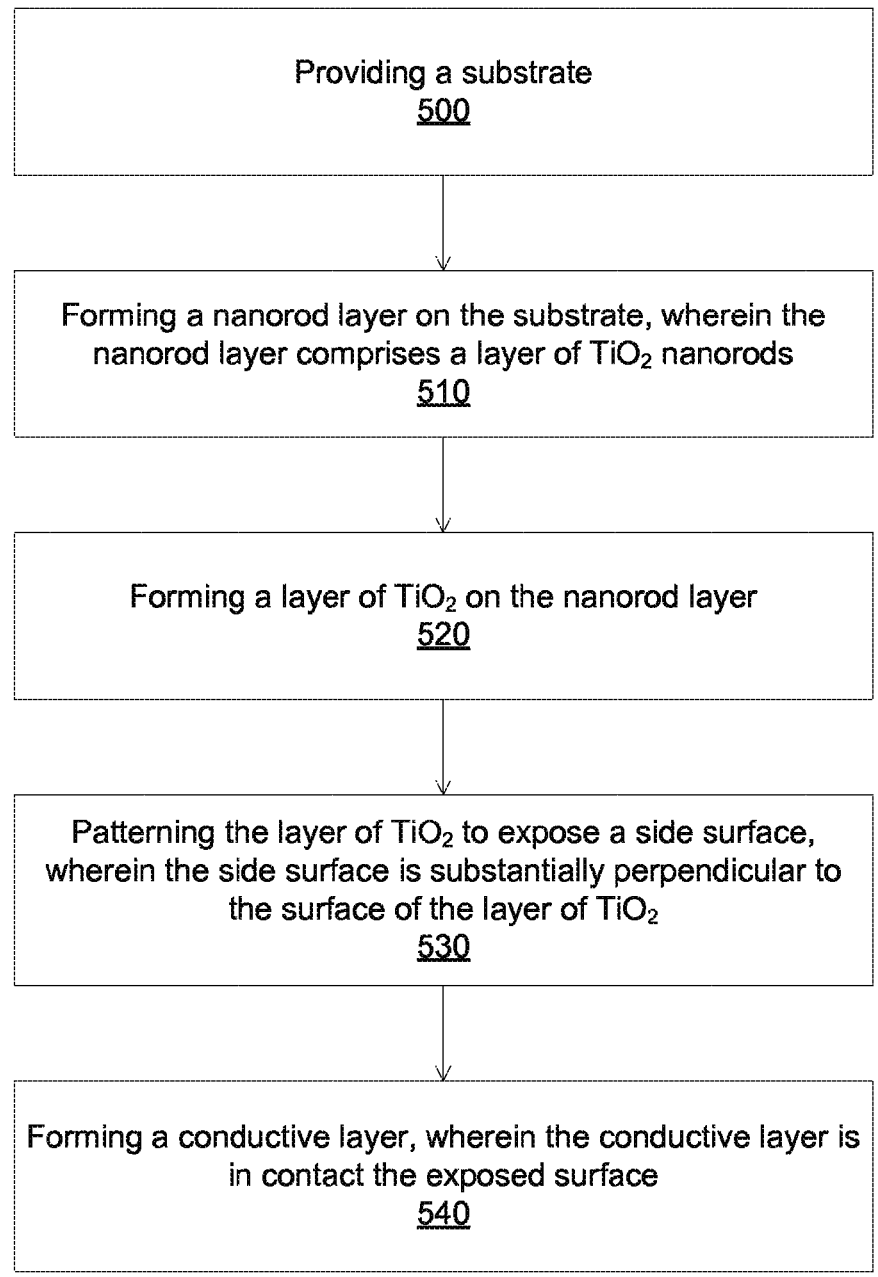
FIG. 5 illustrates a flowchart for forming a device according to some embodiments.

FIG. 5 illustrates a flowchart for forming a device according to some embodiments. The described flowchart is a general description of techniques used to form the devices described above. For example, the flowchart describes techniques for forming an electrode interfacing a dielectric material in a direction perpendicular to the substrate surface. Although certain processing techniques and specifications are described, it is understood that various other techniques and modifications of the techniques described herein may also be used.

In operation 500, a substrate is provided. In operation 510, a layer of $TiO_2$ nanorods can be formed on the substrate. The nanorods can be aligned in a direction parallel to the substrate surface. For example, the substrate can include multiple grooves to accommodate the nanorods. The substrate can also include other layers, such as a connecting layer.

In operation 520, a $TiO_2$ layer is formed on the nanorod seed layer. The $TiO_2$ layer can be formed by one or more sequences of deposition and anneal. For example, a $TiO_2$ layer can be deposited, such as by an ALD or a CVD process. The deposited $TiO_2$ layer can be annealed, for example, in temperatures between 400 and 450 C to recrystallize the deposited $TiO_2$ layer. The thickness of the $TiO_2$ layer can be less than 1000 nm, for example, between 50 and 500 nm. For thick $TiO_2$ layer, multiple sequences of deposition/anneal using thinner layers of $TiO_2$ can be used, for example, to facilitate the crystallization process. The thickness of the thin $TiO_2$ layer can be between 50 and 200 nm.

In operation 530, the $TiO_2$ layer can be patterned to expose a side surface. The side surface can be perpendicular, or substantially perpendicular, to the substrate surface or the $TiO_2$ layer top surface. The patterning process can be performed by a photolithography technique, including masking a desired portion of the $TiO_2$ layer, and etching away the unwanted portion.

In operation 540, a conductive layer is formed in contact with the exposed surface of the $TiO_2$ layer. The conductive layer can be operable as an electrode, generating an electric field perpendicular to the exposed surface, which can experience a high dielectric constant characteristic of the $TiO_2$ layer. In some embodiments, the method can further include forming another electrode, facing an opposite side of the $TiO_2$ layer. The conductive materials can include doped polysilicon, metallic elements such as Pt, W, Ti, Al, metallic alloys, or conductive metal nitrides or oxides. The electrodes can have any thickness, for example between about 5 nm and about 500 nm thick.

Figure 6:
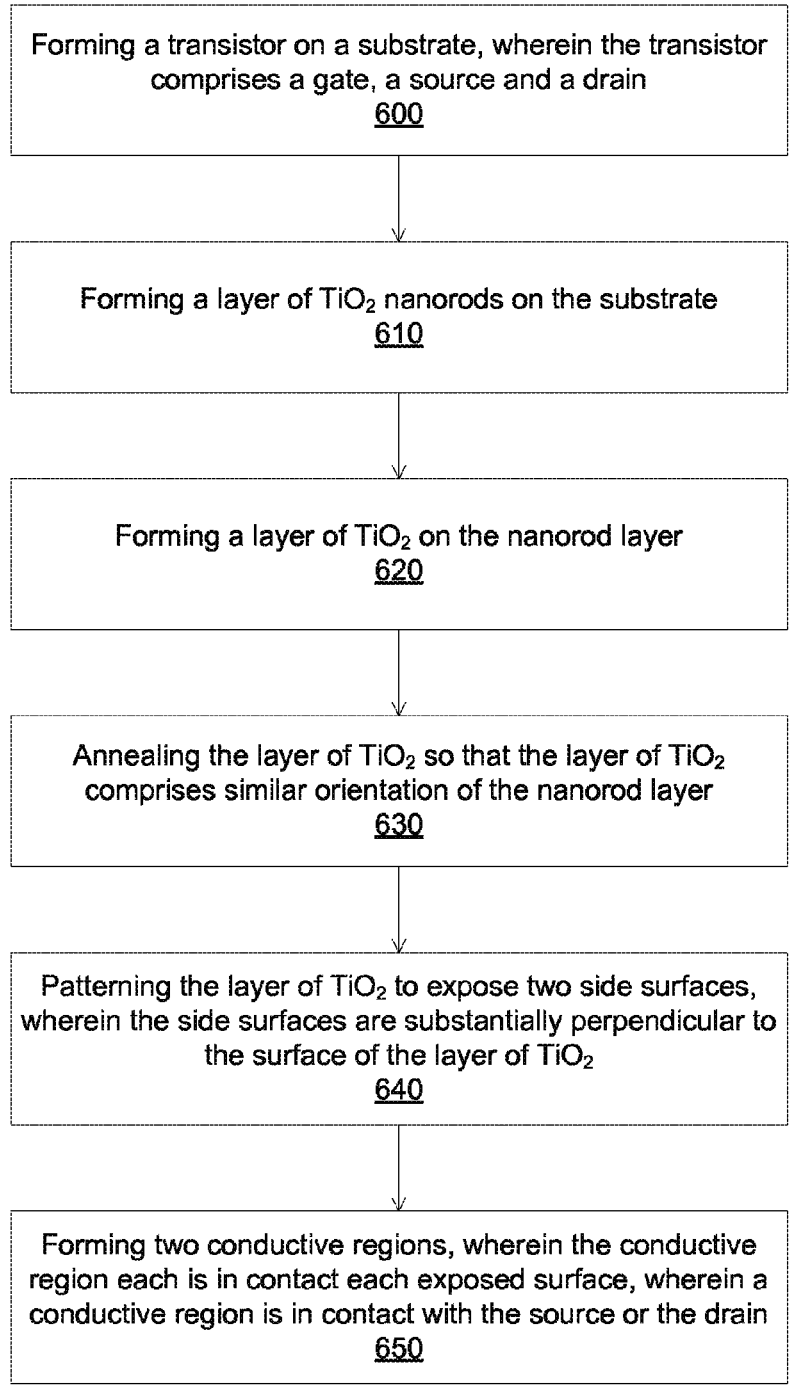
FIG. 6 illustrates a flowchart for forming a memory device according to some embodiments.

FIG. 6 illustrates a flowchart for forming a memory device according to some embodiments. In operation 600, a transistor structure can be formed on a substrate. The transistor can include source and drain regions, a gate dielectric, a gate electrode, and isolation regions to separate between adjacent devices. For example, a MOSFET transistor can be prepared on a silicon substrate. Optional interconnect can be provided. The interconnect may be in-plane with transistor and bottom of the future capacitor, or be raised above the capacitor. A set of capacitor structures (including the grooves, nanorods and $TiO_2$ film) may be formed in a depressed (e.g., etched out) region spatially adjacent to a set of transistor structures, so that the interconnects are then in-plane to the transistor and the top of the capacitors.

In operation 610, a layer of $TiO_2$ nanorods can be formed on a portion of the substrate. The nanorods layer can be disposed in adjacent to the source or drain region of the transistor. The nanorods can be aligned in a direction parallel to the substrate surface. For example, the substrate can include multiple grooves to accommodate the nanorods.

In operation 620, a TiO$_2$ layer is formed on the nanorod seed layer. The TiO$_2$ layer can be formed by one or more sequences of deposition and anneal. For example, a TiO$_2$ layer can be deposited, such as by an ALD or a CVD process. The thickness of the TiO$_2$ layer can be less than 1000 nm, for example, between 50 and 500 nm. In operation 630, the deposited TiO$_2$ layer can be annealed, for example, in temperatures between 400 and 450 C to achieve similar crystal orientation as that of the TiO$_2$ nanorod layer. In some embodiments, operations 620 and 630 can be repeated to achieve thick TiO$_2$ layer. The repeated sequences can use thinner layers of TiO$_2$, such as between 50 and 200 nm.

In operation 640, the TiO$_2$ layer can be patterned to expose a side surface. The side surface can be perpendicular, or substantially perpendicular, to the substrate surface or the TiO$_2$ layer top surface. The patterning process can be performed by a photolithography technique, including masking a desired portion of the TiO$_2$ layer, and etching away the unwanted portion.

In operation 650, conductive layers are formed in contact with the exposed surface of the TiO$_2$ layer. The conductive layers can be operable as an electrode, generating an electric field perpendicular to the exposed surface, which can experience a high dielectric constant characteristic of the TiO$_2$ layer. One conductive layer can be in contact with the source or drain region of the transistor, using the transistor as a control device for the capacitor structure. The conductive materials can include doped polysilicon, metallic elements such as Pt, W, Ti, Al, metallic alloys, or conductive metal nitrides or oxides. The electrodes can have any thickness, for example between about 5 nm and about 500 nm thick.

Figure 7:
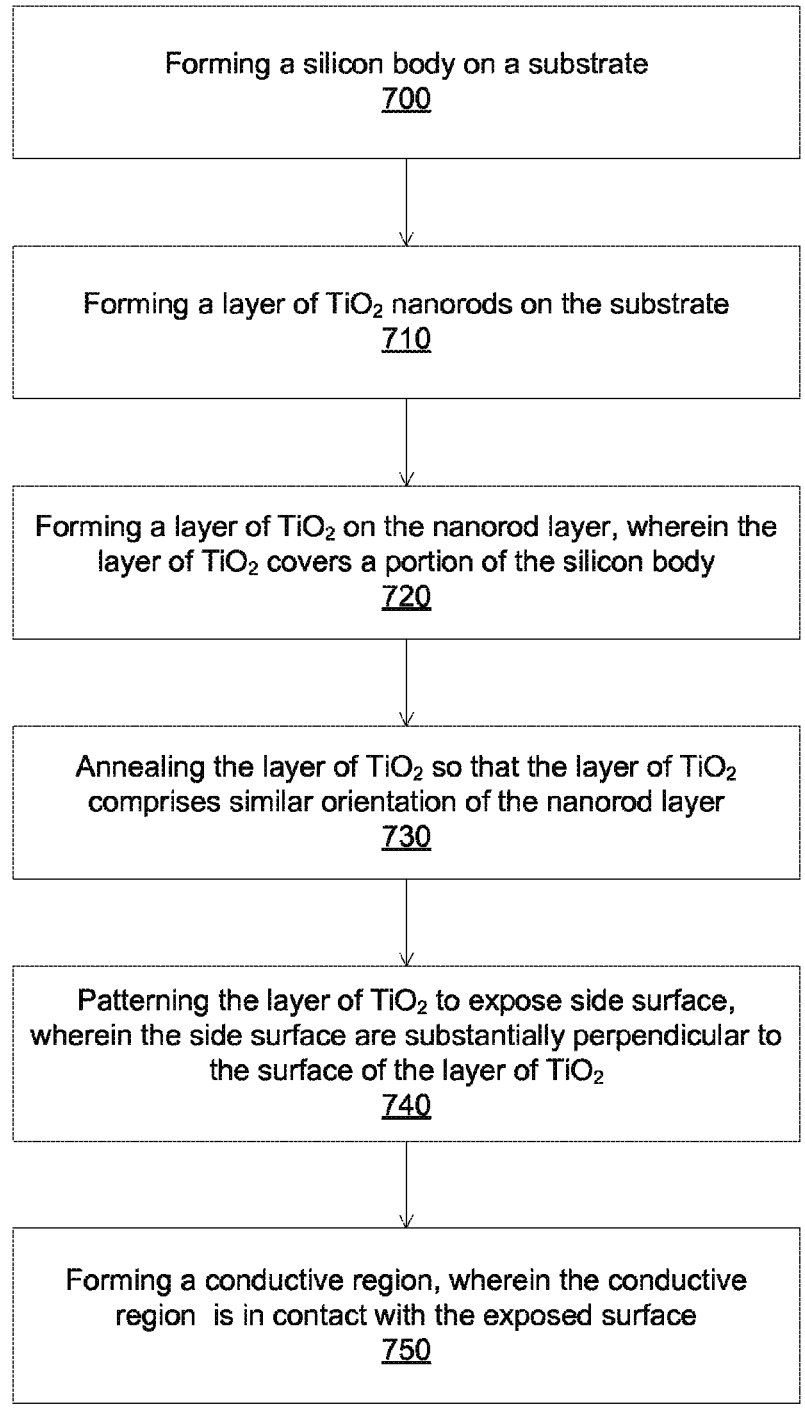
FIG. 7 illustrates a flowchart for forming a vertical gate transistor device according to some embodiments.

FIG. 7 illustrates a flowchart for forming a vertical gate transistor device according to some embodiments. In operation 700, a semiconductor body can be formed on a substrate. The semiconductor body can include silicon material, or other semiconducting materials such as germanium. In some embodiments, the semiconductor body can be an integral part of the substrate, e.g., the substrate can be patterned to form the semiconductor body.

In operation 710, a layer of TiO$_2$ nanorods can be formed on a portion of the substrate. The nanorods layer can be disposed in adjacent to the semiconductor body. The nanorods can be aligned in a direction parallel to the substrate surface. For example, the substrate can include multiple grooves to accommodate the nanorods.

In operation 720, a TiO$_2$ layer is formed on the nanorod seed layer. The TiO$_2$ layer can be formed by one or more sequences of deposition and anneal. For example, a TiO$_2$ layer can be deposited, such as by an ALD or a CVD process. The thickness of the TiO$_2$ layer can be less than 1000 nm, for example, between 50 and 500 nm. In operation 730, the deposited TiO$_2$ layer can be annealed, for example, in temperatures between 400 and 450 C to achieve similar crystal orientation as that of the TiO$_2$ nanorod layer. In some embodiments, operations 720 and 730 can be repeated to achieve thick TiO$_2$ layer. The repeated sequences can use thinner layers of TiO$_2$, such as between 50 and 200 nm.

In operation 740, the TiO$_2$ layer can be patterned to expose a side surface. The side surface can be perpendicular, or substantially perpendicular, to the substrate surface or the TiO$_2$ layer top surface. The patterning process can be performed by a photolithography technique, including masking a desired portion of the TiO$_2$ layer, and etching away the unwanted portion.

In operation 750, a conductive layer is formed in contact with the exposed surface of the TiO$_2$ layer. The conductive layers can be operable as an electrode, generating an electric field perpendicular to the exposed surface, which can experience a high dielectric constant characteristic of the TiO$_2$ layer. One conductive layer can be in contact with the source or drain region of the transistor, using the transistor as a control device for the capacitor structure. The conductive materials can include doped polysilicon, metallic elements such as Pt, W, Ti, Al, metallic alloys, or conductive metal nitrides or oxides. The electrodes can have any thickness, for example between about 5 nm and about 500 nm thick.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising
depositing nanorods of an anisotropic dielectric material on a substrate surface,
wherein the nanorods form a first layer,
wherein the first layer is parallel to the substrate surface,
wherein the nanorods are arranged in a direction parallel to each other,
wherein the nanorods have a first crystal orientation,
wherein the nanorods have a higher dielectric constant along the first crystal orientation than in an orientation perpendicular to the first crystal orientation;
forming a second layer of the anisotropic dielectric material on the first layer,
wherein the second layer comprises substantially the same crystal orientation as the first crystal orientation;
patterning the second layer to expose a side surface of the second layer,
wherein the side surface is substantially perpendicular to the substrate surface,
wherein the side surface is substantially perpendicular to the first crystal orientation;
forming a conductive layer in contact with the side surface,
wherein the conductive layer is operable as an electrode.

2. A method as in claim 1 in which the nanorods of the anisotropic dielectric material comprise rutile TiO$_2$ nanorods.

3. A method as in claim 2 further comprising
growing the TiO$_2$ nanorods on a seeded substrate;
collecting and screening the TiO$_2$ nanorods to provide nanorods having an aspect ratio greater than 5.

4. A method as in claim 2 wherein an average diameter of the nanorods is between 50 and 200 nm.

5. A method as in claim 2 wherein the surface of the substrate is grooved for accepting the nanorods.

6. A method as in claim 2 wherein forming the second layer comprises performing a sequence of depositing the second layer and annealing the deposited second layer.

7. A method comprising
forming multiple grooves in a substrate;
depositing nanorods of an anisotropic dielectric material in the grooves,
wherein the nanorods form a first layer,
wherein the first layer is parallel to the substrate surface,
wherein the nanorods are arranged in a direction parallel to each other,
wherein the nanorods have a first crystal orientation,
wherein the nanorods have a higher dielectric constant along the first crystal orientation than in an orientation perpendicular to the first crystal orientation;

depositing a second layer of the anisotropic dielectric material on the first layer;

annealing the deposited second layer,
  wherein the annealed second layer comprises substantially the same crystal orientation as the first crystal orientation;

patterning the second layer to expose a side surface of the second layer,
  wherein the side surface is substantially perpendicular to the substrate surface,
  wherein the side surface is substantially perpendicular to the first crystal orientation;

forming a conductive layer in contact with the side surface,
  wherein the conductive layer is operable as an electrode.

8. A method as in claim 7 in which the nanorods of the anisotropic dielectric material comprises rutile $TiO_2$.

9. A method as in claim 8 further comprising
growing the $TiO_2$ nanorods on a seeded substrate;
collecting and screening the $TiO_2$ nanorods to provide nanorods having aspect ratio greater than 5.

10. A method as in claim 8 wherein an average diameter of the nanorods is between 50 and 200 nm.

11. A method as in claim 8 wherein a diameter of the grooves is between 250 and 600 nm.

12. A method as in claim 8 wherein a depth of the grooves is between 15 and 160 nm.

13. A method as in claim 8 further comprising
vibrating the substrate to align the nanorods with the grooves.

14. A method as in claim 8 wherein multiple sequences of depositing a second layer and annealing the deposited second layer are performed.

15. A method as in claim 8 wherein the annealing is performed at temperatures between 400 and 450 C.

16. A method as in claim 8 wherein patterning the second layer comprises a lithography process.

17. A method as in claim 8 wherein the second layer is patterned to expose two opposite side surfaces, and wherein two conductive layers are formed contacting the two opposite side surfaces of the second layer to form a capacitor structure.

18. A method as in claim 8 further comprising
forming a transistor, wherein the source or drain of the transistor is coupled with the conductive layer.

* * * * *